United States Patent [19]

Nam

[11] Patent Number: 5,598,121

[45] Date of Patent: Jan. 28, 1997

[54] SWITCHING CIRCUIT FOR EMBODYING AN I/O SIGNAL IN A SINGLE TERMINAL

[75] Inventor: Myung-Hyun Nam, Seoul, Rep. of Korea

[73] Assignee: Samsung Electronics Co., Ltd., Suwon, Rep. of Korea

[21] Appl. No.: 126,967

[22] Filed: Sep. 27, 1993

[30] Foreign Application Priority Data

Nov. 23, 1992 [KR] Rep. of Korea ................ 1992-22039

[51] Int. Cl.[6] ....................... H03K 17/28; H03K 17/296; H03K 17/62
[52] U.S. Cl. ......................... 327/392; 327/398; 327/401; 327/405
[58] Field of Search .................................... 307/475, 595, 307/242; 328/60, 62, 116; 327/392, 398, 401, 403, 404, 405

[56] References Cited

U.S. PATENT DOCUMENTS

| | | | |
|---|---|---|---|
| 4,682,048 | 7/1987 | Ishimoto | 307/595 |
| 4,684,823 | 8/1987 | Dayton | 327/392 |
| 4,980,580 | 12/1990 | Ghoshal | 307/475 |
| 5,006,728 | 4/1991 | Yonekura | 327/392 |
| 5,027,003 | 6/1991 | Haight | 327/405 |
| 5,134,321 | 7/1992 | Mehta | 327/404 |
| 5,237,211 | 8/1993 | Tanaka | 307/241 |

*Primary Examiner*—William L. Sikes
*Assistant Examiner*—Tiep H. Nguyen
*Attorney, Agent, or Firm*—Charles R. Donohoe; Stephen R. Whitt

[57] ABSTRACT

A switching circuit for outputting input and output signals from a single terminal includes an I/O signal interface circuit for forming a current path in parallel with a switch when a voltage at both terminals of the switch changes from high state to low state and for opening the current path when receiving a delay signal. An I/O signal separator provides the delay signal of predetermined time width when forming the current path to the I/O signal interface circuit and for blocking the current path during the delay period. Repeated and consecutive striking of a singular switch is ignored since only the first strike is effective. In addition, a display connected to a previously pressed switch remains continuously lighted when an interval between two consecutive struck different switches is shorter than the delay period. By selectively coupling a number of I/O signal interface circuit and separator pairs, input and output terminals associated with function-selecting switching circuits can be reliably embodied in a single terminal construction. Such single terminal construction facilitates adding switches and displays, as necessary, without concern for an otherwise considerable increase in the number of input and output terminals. Additionally, the simplicity of a single terminal construction serves to significantly reduce the number of peripheral circuit components as compared to conventional switching circuits provided with a two terminal I/O construction.

12 Claims, 6 Drawing Sheets

SWITCHING CIRCUIT FOR EMBODYING AN I/O SIGNAL IN A SINGLE TERMINAL

BACKGROUND OF THE INVENTION

1. Field of the Invention

The present invention relates to a function-selecting switching circuit such as may be found in apparatuses such as music centers, and more particularly to a function-selecting switching circuit wherein input and output terminals of a switch-path are incorporated into a single I/O terminal thereby decreasing the number of otherwise necessary terminals and resulting in a circuit which can be made significantly more miniature requiring fewer components.

2. Description of the Prior Art

Figure 1:
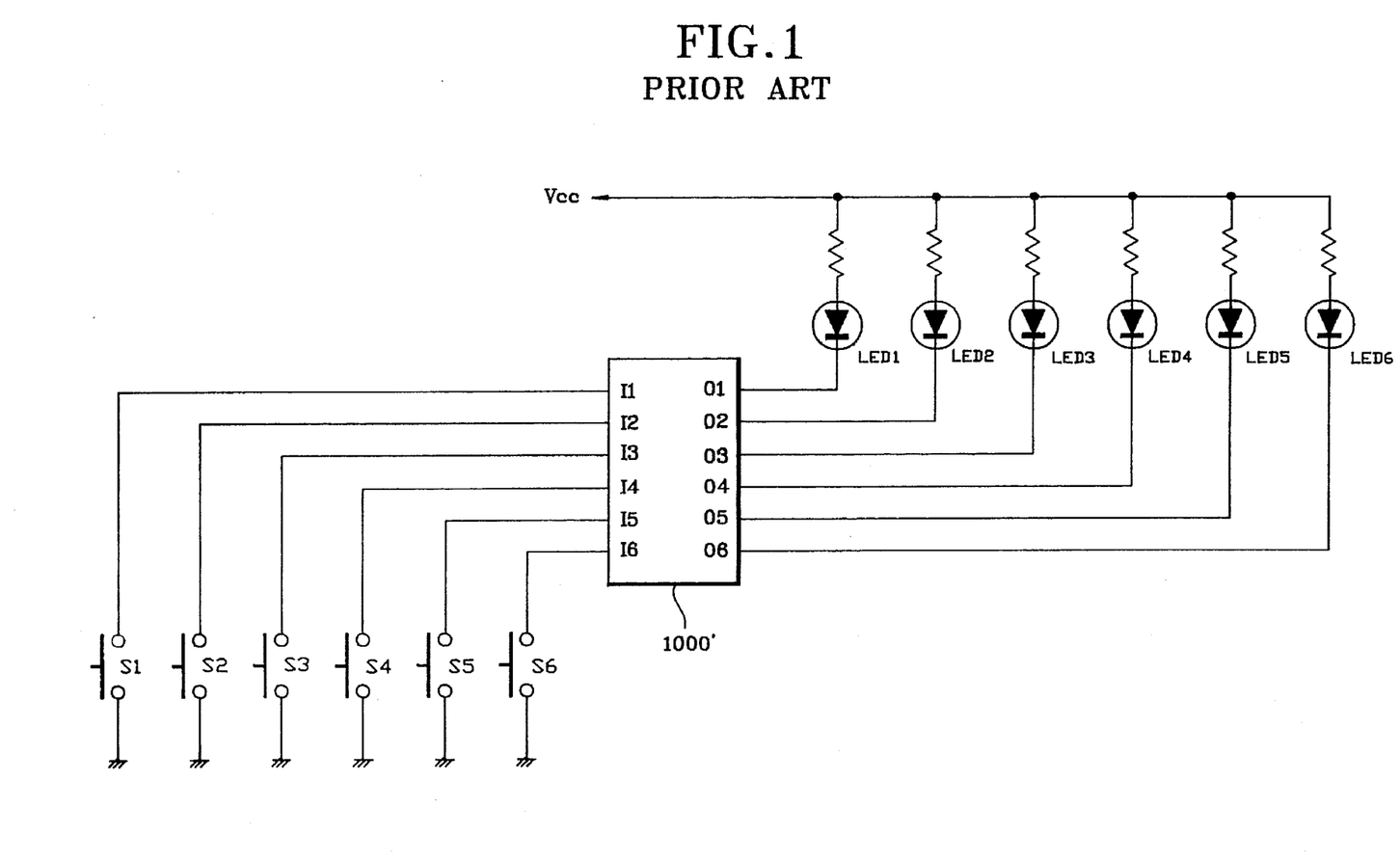
FIG. 1 is a block diagram of a conventional switching circuit provided with separate input and output terminal interfacing.

FIG. 1 shows a conventional switching circuit provided With a plurality of separate input and output terminal pairs, each pair associated-with a corresponding switch-path.

When a first switch S1, among operably connected switches S1 to S6, is pressed, a trigger signal is supplied to a switching I/O integrated circuit (IC) 1000' via first input terminal I1. In response thereto, an output signal is generated and output at first output terminal O1, causing first display LED1 to turn on.

In conventional switching circuits such as that shown in FIG. 1, separate input and output terminals are provided, one for inputting a switch-path signal from a switch and one for outputting an operative output signal in response to the switch-path signal. Accordingly, such a construction necessarily results in a high component operative circuit as each of the separate terminals requires distinct circuitry therefor. It is apparent therefore that separate-terminal function-selecting switching circuits hamper miniaturization of circuit design.

SUMMARY OF THE INVENTION

It is an object of the present invention to provide a switching circuit which embodies both input and output terminals of each switch-path along a single terminal. A switching I/O circuit is constructed which enables a logic signal, operative along a common switch-path, to be simultaneously input and output via a single terminal while preserving the operative independence of an output signal from the effects of the corresponding input signal. In this manner, both the total number of effective terminals, as well as peripheral circuit components associated therewith, are significantly fewer than in conventional switching circuits provided with separate I/O terminals.

To achieve the above object, a function-selecting switching circuit according to the present invention is provided for which every switch-path is provided with its own I/O signal interface circuit coupled to a corresponding I/O signal separator circuit.

Each interface circuit is formed in parallel with each corresponding switching element to selectively control a current path to a commonly shared circuit component, such as an LED. When closed (activated), a switching element causes the current path to the commonly shared circuit component to be similarly activated, which current is generated in response to a voltage change across terminals of the switching element from a logic high state to a logic low state.

The I/O signal interface circuit responds to the activation of the switching element and the current path and functions to maintain the current path operative beyond a predetermined delay period. Each I/O signal separator responds to cooperatively connected signals from the corresponding I/O signal interface circuit to provide a necessary delay for which the respective circuit element is maintained operative.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENTS

Figure 2:
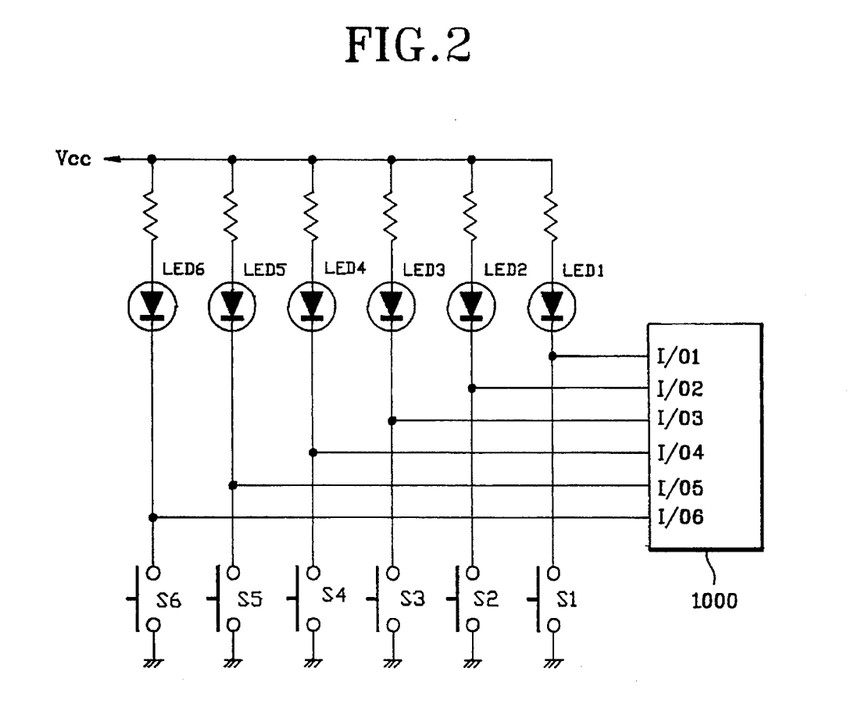
FIG. 2 is a block diagram of an embodiment according to the present invention showing a switching circuit provided with single terminal I/O interfacing.

A switching circuit provided with single terminal I/O interfacing is shown in FIG. 2. As shown, a switching I/O IC 1000 outputs an operative signal from a single terminal shared by an input thereto. Six switches (S1 to S6) and six displays (LED1–LED6) are respectively connected to corresponding common I/O terminals (I/O1–I/O6) of switching I/O IC 1000.

Figure 3:
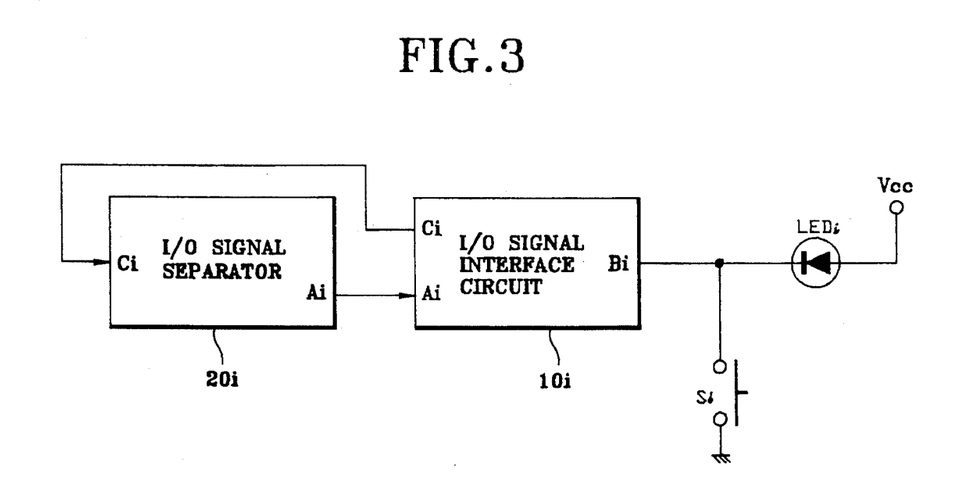
FIG. 3 is a detailed block diagram of a single switch portion of the switching circuit shown in FIG. 2.

FIG. 3 is a detailed block diagram of a single switch-path of switching I/O IC 1000. As shown, each single switch-path includes an I/O signal interface circuit 10-i connected to an operational switch Si and to a corresponding display LEDi, and an I/O signal separator 20-i. A switching circuit in accordance with the present invention, would necessarily have, arranged in parallel, as many single switch-paths of the type shown in FIG. 3 as there are switches. Hence, a six-switch switching circuit would include in addition to six operative switches and corresponding number of display devices, at least six I/O signal interface circuits and six I/O signal separators.

Figure 4:
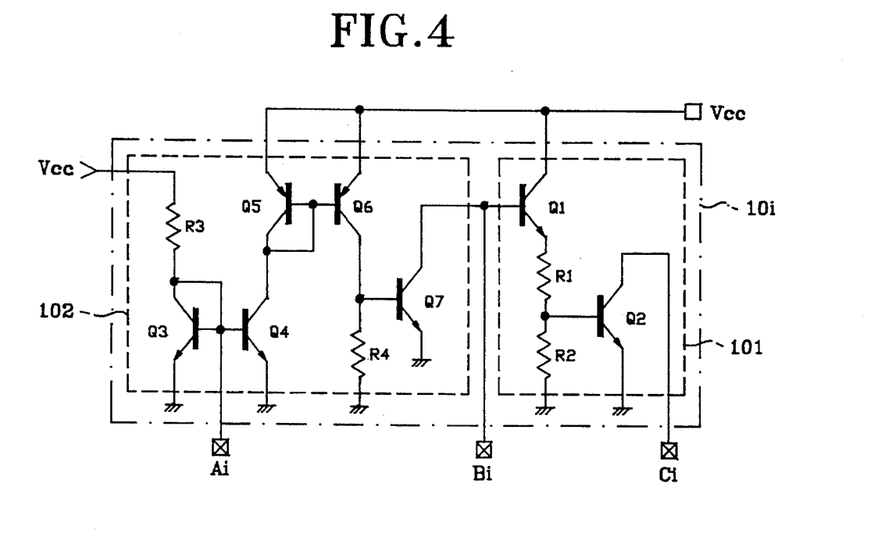
FIG. 4 is a detailed circuit diagram of the I/O signal interface circuit shown in FIG. 3.
Figure 5:
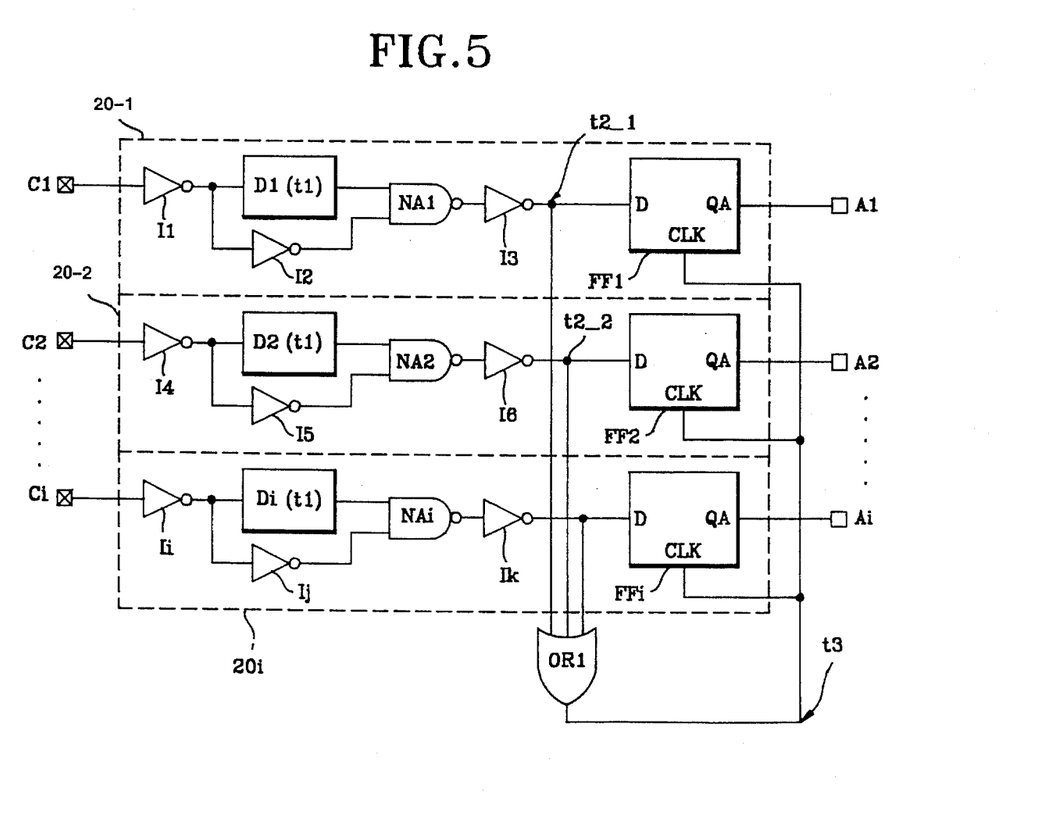
FIG. 5 is a detailed circuit diagram of a plurality of I/O signal separators for connection to corresponding ones of I/O signal interface circuits such as that shown in FIG. 3.

FIG. 4 is a detailed circuit diagram of the I/O signal interface circuit 10-i shown in FIG. 3. Referring to FIG. 3, each I/O signal interface circuit 10-i is provided with an input processor portion 101 which processes an input signal Bi in response to a pressing of external switch Si (shown in FIG. 3). The output (Ci) of input processor portion 101 is then coupled to an input of I/O signal separator 20-i which is shown in FIG. 5 and whose operation is to be described below.

Each I/O signal interface circuit is also provided with an output processor portion 102 which processes a response signal (Ai) which properties are also to be described below in connection with the description of the I/O signal separators (20-1 to 20-i) illustrated in FIG. 5. Output processor portion 102 processes response signal Ai to generate an output to a corresponding display unit/element (LEDi—also shown in FIG. 3).

Input processor portion 101 includes transistors Q1 and Q2. Transistor Q1 has its base connected to I/O terminal Bi, its collector connected to power supply Vcc, and its emitter connected to resistors R1 and R2. Similarly, the base of transistor Q2 is connected between resistors R1 and R2, while its collector is connected directly to I/O signal separator 20-i via terminal Ci.

Output processor portion 102 includes transistors Q3 and Q4 whose bases are commonly connected to terminal Ai which functions as an output terminal for coupled I/O signal separator 20-i. The collector of transistor Q4 is connected to the collector and base of transistor Q5 as well as to the base of transistor Q6. The emitters of transistors Q5 and Q6 are connected to the power supply Vcc, and the collector of transistor Q6 is connected to the base of transistor Q7. The collector of transistor Q3 is biased via a resistor R3, while the collector of transistor Q7 and input processor portion 101 are commonly connected to I/O terminal Bi.

FIG. 5 is a detailed circuit diagram of I/O signal separator 20-i shown in FIG. 3 and shown commonly coupled, in parallel, to a plurality of I/O signal separators of substantially identical construction (20-1, 20-2 . . . ), and including an OR gate OR1.

The operation of I/O signal separator 20-i will now be described in connection with the detailed circuit diagram of FIG. 5.

I/O signal separator 20-i includes an inverter Ii for inverting the output from I/O signal interface circuit 10-i input via terminal Ci, delay circuit Di connected to the output terminal of the inverter Ii and which functions to delay the output of inverter Ii by a delay period t1, inverter Ij also connected to the output terminal of inverter Ii and which inverts the output of inverter Ii, NAND gate NAi connected to receive the outputs of delay circuit Di and inverter Ij and which provides a logical operation on the respective two outputs, and inverter Ik connected to the output terminal of NAND gate NAi inverting the received NANDed output. Also included is flip-flop FFi having both its D input and its clock terminal CLK selectively coupled to the output of inverter Ik. An output QA of the flip-flop FFi is connected to the terminal Ai which operates as the input terminal of output processor portion 102 of I/O signal interface circuit 10-i.

Each I/O signal separator (20-1 to 20-i) is provided with like construction with an output from each of corresponding inverters (I3, I6 . . . Ik) being commonly coupled to each of corresponding flip-flop (FF1, FF2 . . . FFi) clock terminals CLK via OR gate OR1. Under these conditions, the clocking of any one of the flip-flops (FF1–FFi) is potentially affected by a logic transition at any of the other flip-flops.

Figure 6A:
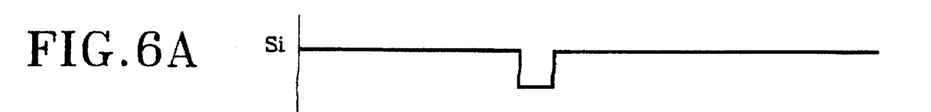
FIGS. 6A and 6B are waveforms illustrating a relationship of signal responses at respective nodes Si and Bi according to the present invention.
Figure 6B:
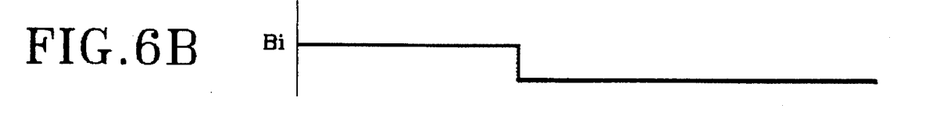

FIGS. 6A–6B show waveforms for illustrating the relationship between a signal response (Si) across terminal nodes of switch Si, reflecting a voltage change thereacross caused by someone temporarily depressing this switch, and I/O terminal Bi, corresponding to the voltage at node Bi immediately before and after a temporary depressing of switch Si.

Referring to FIG. 6A, a low-level signal is output from switch Si in response to switch Si being pressed since, as shown in FIG. 3, a connection is made to ground.

FIG. 6B shows that a logic low across the terminals of switch Si will cause I/O terminal Bi to also go low thereby turning-on display LEDi which will stay lighted under the control of I/O signal interface circuit 10-i and I/O signal separator 20-i even after switch Si is disengaged and the voltage across the switch terminals resumes a logic-high (open-connection) value.

FIGS. 7A–7K show in greater detail response waveforms along respective portions of an operative switching circuit according to the present invention where single terminal operation is described in connection with switches S1 and S2, which switches are depressed consecutively and at regular intervals apart.

FIGS. 8A–8K show response waveforms for switches S1 and S2 under a condition where the second switch is depressed before an adequate predetermined delay period, provided by an I/o signal separator associated with a previously depressed switch, may have expired.

FIGS. 9A–9E show operational states along respective portions of the switching circuit of the present invention under the condition where a previously pressed switch is pressed repeatedly and before a different switch is struck.

Figure 10:
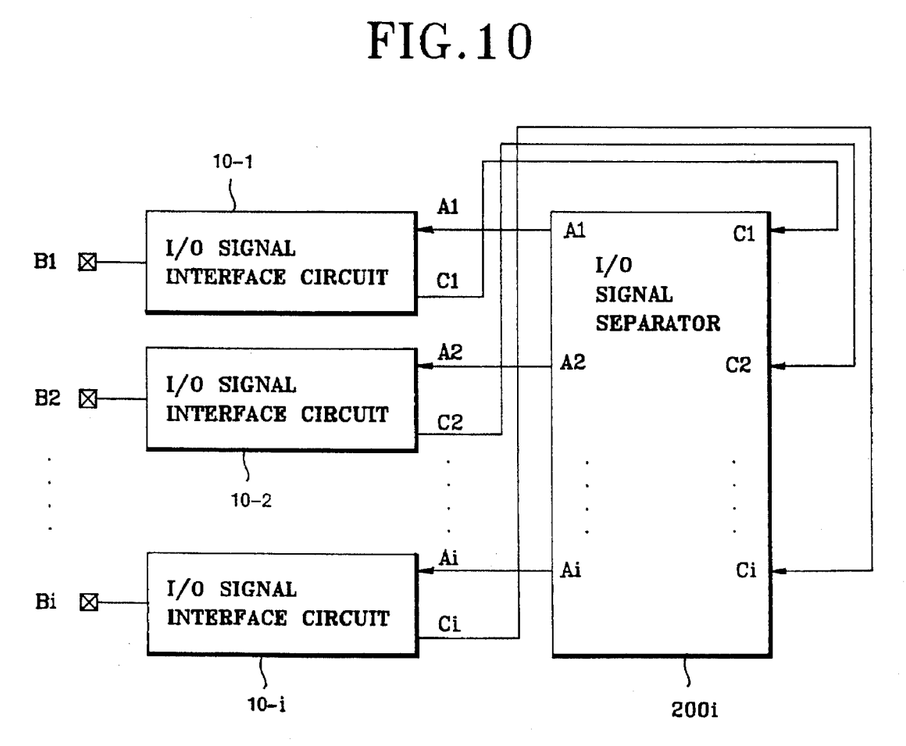
FIG. 10 is a detailed block diagram showing another embodiment of the switching circuit according to the present invention.

FIG. 10 is a block diagram showing another embodiment of the switching circuit according to the present invention, wherein I/O terminals B1–Bi are provided to easily connect to a large number of switches and displays, coupling I/O signal interface circuits 100-1 to 100-i and I/O signal separator 200-i selectively thereto in a desired manner.

The operation of the present invention will now be described in connection with the signal waveforms shown in FIGS. 7A–7K. The waveforms in FIGS. 7A and 7B indicate the voltage drop across first-and second switches S1 and S2 which are respectively coupled to I/O signal interfacing circuits 10-1 and 10-2 (not shown) which are identical to the I/O signal interfacing circuit 10-i shown in connection with FIGS. 3 and 4 and which are in turn respectively coupled to I/O separators 20-1 and 20-2 illustrated in FIG. 5.

Figure 7A:
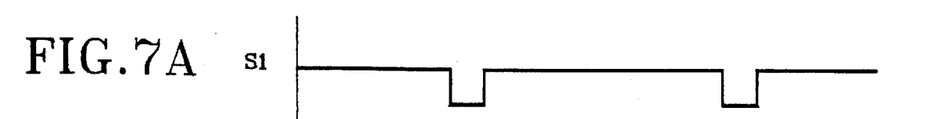
FIGS. 7A to 7K are waveforms showing the operational states of respective portions of the switching circuit according to the present invention.
Figure 7B:
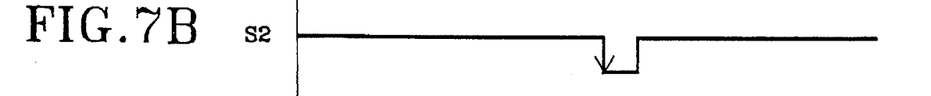

A voltage transition from high-low-high voltage in each of FIGS. 7A and 7B corresponds to a depression of a respective one of switches S1 and S2. As described in connection with FIGS. 6A and 6B, a high-to-low transition across the terminals of switch S1 (S2) is sufficient to drive a logic low level to the B1 (B2) terminal which feeds first (second) I/O signal interface circuit 10-1 (10-2) as well as provides a current path to display LED1 (LED2) thereby turning it on.

Figure 7C:
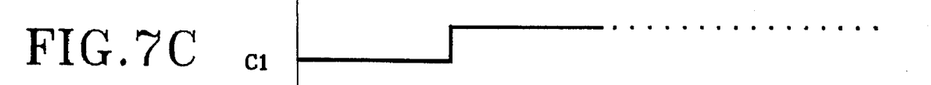

Accordingly, when first switch S1 is pressed, a low-level signal as shown in FIG. 7A is supplied to the base of transistor Q1 in the input processor portion 101 via I/O terminal B1 of first I/O signal interface circuit 10-1. At this point in time, the low-level signal turns NPN transistor Q1 off, and also causes transistor Q2 connected to the emitter of transistor Q1 to also turn-off. Because the collector of transistor Q2 is in the open (floating) state, a high-level output signal as shown in FIG. 7C is seen at the first terminal C1 input of first I/O signal separator 20-1. The logic level of first terminal C1 of the first I/O Signal separator 20-1 is supplied on the basis of both the signal level of pressed switch S1 on input processor portion 101 as well as on the signal level of output processor portion 102 of first I/O signal interface circuit 10-1.

Because it is unknown what state either switch S1 or the output of output processor portion 102 will be in when switch S2 is depressed, the logic level of first terminal C1 when S2 is pressed (shown in FIG. 7C as dotted lines) is independent, in effect, on the operation of terminal B2 and therefore on the turning-on of LED2. The same is true for second terminal C2 when switch S1 is again depressed (represented by dotted lines in FIG. 7D).

Figure 7D:
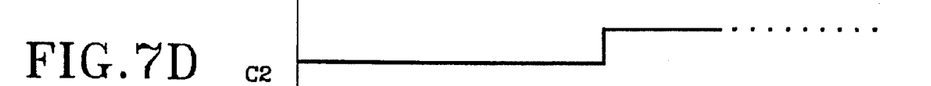
Figure 7E:
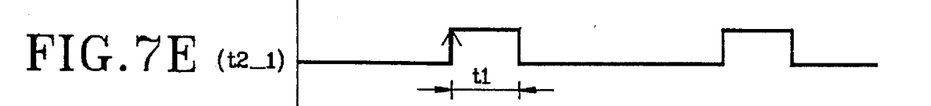

When a delay period for delay circuit D1 of first I/O signal separator 20-1 is equal to t1, a high-level signal from first I/O signal interface circuit 10-1 is input to first terminal C1 (FIG. 7C). And, as shown in FIG. 7E, a high-level signal transition, having a period at least equal to delay period t1 is seen at output node t2_1 of inverter I3 on the basis of coupling inverters Ii–I3, NAND gate NA1 and delay circuit D1 as indicated in FIG. 5.

Figure 7F:
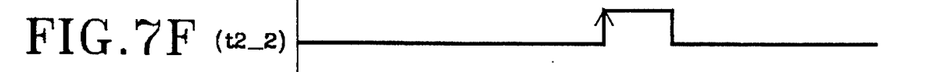
Figure 7G:
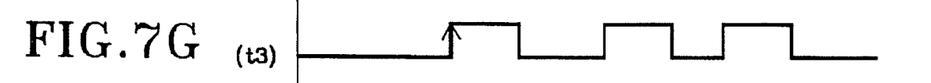

The output of the inverter I3 is then supplied to the D input of first flip-flop FF1. When a plurality of I/O signal separators are provided as in FIG. 5, the output of inverter I3 is logically and commonly combined with the outputs of similarly situated inverters I6 . . . Ik and connected to OR gate OR1. The ORed result (node t3) is then provided as a common clock pulse to each of flip-flops FF1–FFi as shown in FIG. 5. FIG. 7G shows the signal waveform at node t3 after three consecutive switch transitions of switches S1 and S2.

Figure 7H:
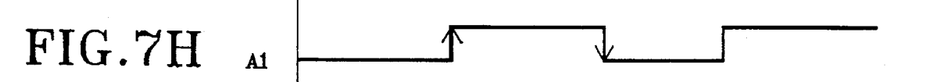

Accordingly, one clock pulse interval corresponds to a pressing from a first switch to the pressing of a very next switch. On this basis, first flip-flop FF1 outputs a high-level signal as shown in FIG. 7H to its output QA for approximately one entire period of a clock pulse shown in FIG. 7G. The high-level signal shown in FIG. 7H is output to terminal A1 serving as the input terminal of output processor 102 in the first I/O signal interface circuit 10-1.

Figure 7I:
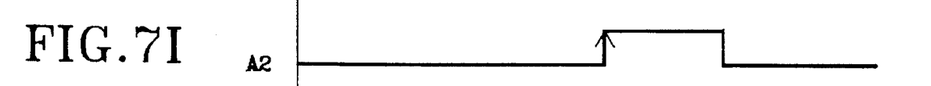
Figure 7J:
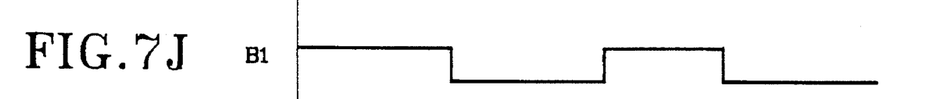
Figure 7K:
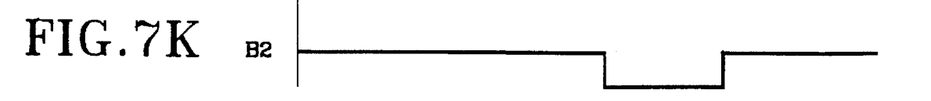

At this point, because the bases of transistors Q3 and Q4 of output processor portion 102 in first I/O signal interface circuit 10-1 are connected to terminal A1, transistors Q3 and Q4 turn-on. In response, transistors Q5 and Q6 having bases connected to the collector of transistor Q4, also turn-on. When transistor Q6 turns on, transistor Q7 having its base connected to the collector of transistor Q6 is in a saturated state, and therefore a low-level signal, as shown in FIG. 7J, is output to first I/O terminal B1 which will thus maintain a low state even after the switch resumes its non-pressed state and until another switch is pressed.

While terminal B1 is maintained at a low state, a first display LED1 connected to the first I/O terminal B1 will remain lighted. Accordingly, the result is that once a first switch S1 is pressed, the corresponding first display LED1 will remain on, and the switch S1 need not be continuously pressed for it to stay lighted.

When second switch S2 is then pressed, an initial switch signal response is generated as indicated by the waveform shown in FIG. 7B. Transistors Q1 and Q2 associated with I/O signal generator 10-2 become turned off, causing second terminal C2 to a logic high level immediately following a pressing of switch S2 (FIG. 7D).

As with I/O signal generator 10-1, the output of second terminal C2 is coupled as an input terminal to a corresponding second I/O signal separator 20-2 shown in FIG. 5. Referring to FIG. 7F, a high-level pulse signal is output at node t2_2 of I/O signal separator 20-2. The period of this pulse is at least equal to the period of delay time t1 associated with delay circuit D2. The high level pulse signal is thus generated by the combination of inverters I4 to I6, NAND gate NA2 and delay circuit D2 coupled to output node t2_2 via inverter I6.

Node t2_2 is coupled to both the D input of flip-flop 2 (FF-2) as well as to an input terminal of OR gate OR1 which OR gate is commonly shared at respective input terminals thereof by the corresponding outputs of inverters I3,I6 . . . Ik, from each I/O signal separator delay stage. Consequently, a high level pulse transition at each of nodes t2_1 and t2_2, will cause OR gate OR1 to generate a clock pulse train (t3) such as is shown in FIG. 7G. A logic high pulse transition at node t2-2 will therefore be clocked in to the D input of flip-flop FF2 by clock pulse t3. During this clock period, a high-level signal as shown in FIG. 7I will be output to terminal A2 of second flip-flop FF2 which terminal also serves as the input terminal of output processor 102 in second I/O signal interface circuit 10-2 associated therewith.

When output processor 102 of second I/O signal interface circuit 10-2 receives the high level signal from terminal A2, transistors Q3 to Q7 turn on, causing a low-level signal (shown in FIG. 7K) to be output to second I/O terminal B2.

At that point in time, a high-level signal is output to first I/O terminal B1 of first I/O signal interface circuit 10-1 and a low-level signal to second I/O terminal B2 of second I/O signal interface circuit 10-2. Under these conditions, first display LED1 is turned off and second display LED2 is turned on, at least until a different switch other that S2 is subsequently pressed.

When transistor Q7 in the output processor 102 of I/O signal interface circuit 10-i is large, the current amount applied to I/O terminal Bi can be selectively adjusted to provide adequate drive force to display LED-i.

The waveforms in FIGS. 8A to 8K show operational states along the same various nodes as in FIG. 7A to 7K but under the condition that the subsequently depressed switch is pressed before delay period t1, programmed into the delay stage of each of the I/O signal separators 20-1 to 20-i, expires. More particularly, a time (t0), defined as the period between consecutive logic low transitions at switches S1 and S2, is smaller than delay period t1.

The logic state of those signals at each of terminal nodes S1, S2, C1, C2, t2_1, and t2_2, on the basis of an initial striking of first switch S1 followed by a striking of second switch S2, is shown in FIGS. 8A to 8F, respectively.

Figure 8A:
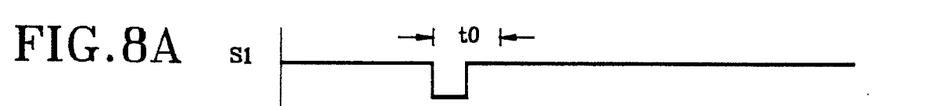
FIGS. 8A to 8K are waveforms illustrating the relationship between delay time and adjustment of switching circuit sensitivity as a function of the predetermined length of a delay period and the time between consecutive different-switch depressions.
Figure 8B:
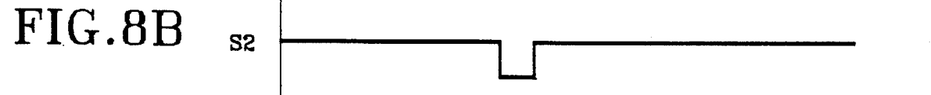
Figure 8C:
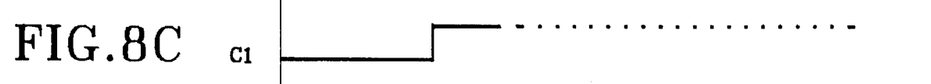
Figure 8D:
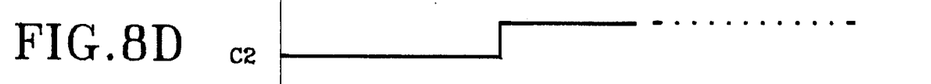
Figure 8E:
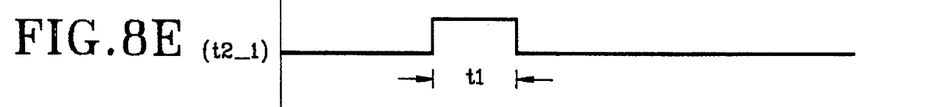
Figure 8F:
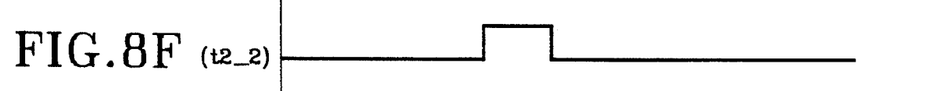
Figure 8G:
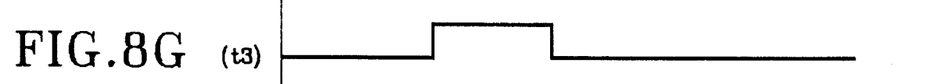

When the waveforms shown in FIGS. 8E and 8F are logically added by OR gate OR1 commonly shared by I/O signal separators 20-1 and 20-2, its output t3 is as shown in FIG. 8G.

Because the interval (t0) between subsequent switch strikes of S1 and S2 is shorter than delay period t1 of delay circuit D1, the edge triggered output latch signal at node t3 does not respond to the second terminal C2 signal caused by second switch S2. Hence, a second clock pulse is not generated to turn-on LED2—as when second terminal A2 goes logic high and as would have been the case had t2-2 gone logic-high only after delay period t1 had expired.

Figure 8H:
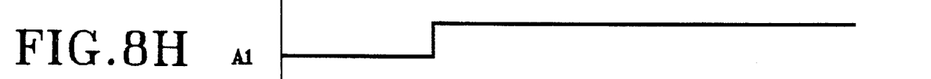
Figure 8I:
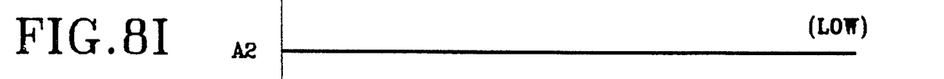
Figure 8J:
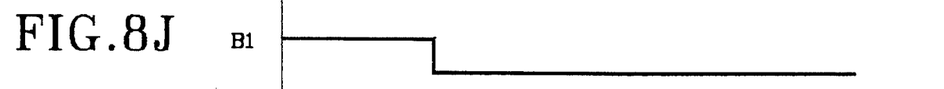
Figure 8K:
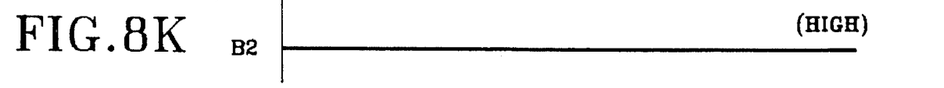

The waveform (t3) shown in FIG. 8G is provided as the clock pulse to first and second flip-flops FF1 and FF2 in the respective first and second I/O signal separators 20-1 and 20-2. The output of first flip-flop FF1 in the first I/O signal separator 20-1 is the signal shown in FIG. 8H, and the output of the second flip-flop FF2 in the second I/O signal separator 20-2 is a low-level signal as shown in FIG. 8J. When the waveform shown in FIG. 8H is output to the terminal A1 serving as the input terminal of the output processor 102 in the first I/O signal interface circuit 10-1, transistors Q3 to Q7 of output processor 102 are turned on to allow first I/O terminal B1 to output the signal shown in FIG. 8J. In turn, first display LED1 connected to the first I/O terminal B1, turns on. However, when the waveform shown in FIG. 8I is output to the terminal A2 of the output processor 102 in the second I/O signal interface circuit 10-2, transistors Q3 to Q7 of the respective output processor 102 are turned off causing the second I/O terminal B2 to output a high-level signal as shown in FIG. 8K. Under these conditions, second display LED2 connected to the second I/O terminal B2, does not turn on.

Accordingly, by adjusting the delay time t1 of the delay circuits in each of the I/O signal separators 20-1 . . . 20-i, a selected striking interval between signals generated by pressed switches can be selectively adjusted by a user.

Figure 9A:
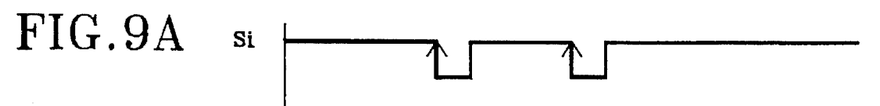
FIGS. 9A to 9E are waveforms illustrating circuit operation in response to consecutive same-switch depressions.

The waveforms in FIGS. 9B–9E show the operational states along nodes Ci, t3, Ai and Bi, respectively, brought about by a consecutive striking of the same switch Si, which switch logic states are shown in FIG. 9A. Only the initially pressed switch operates to turn on the coupled LED-i. Subsequent striking of the same switch does not affect the response at node Ci and thus the logic state of node t3 after some initial delay period t1 is that of logic low state.

Figure 9B:
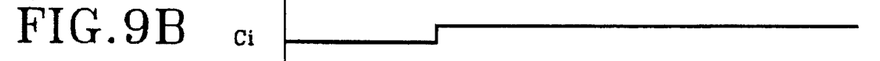

More specifically, when a signal of switch Si is repeatedly input as shown in FIG. 9A, the terminal Ci which is the input terminal of the I/O signal separator 20-i is supplied with both a bias signal from switch Si as well as with a preceding stage output. Thus, the signal response waveform at terminal Ci is as shown in FIG. 9B.

Figure 9C:
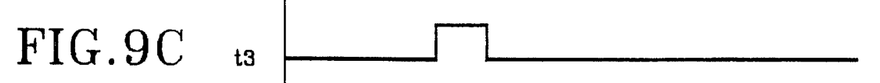
Figure 9D:
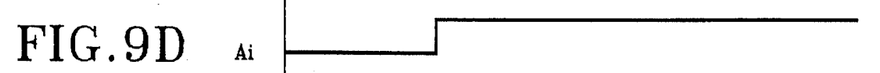

Consequently, the signal supplied to the D input and clock terminal CLK of the flip-flop FFi is as shown in FIG. 9C, and the output from the output QA of the flip-flop FFi is a high-level signal as shown in FIG. 9D which is supplied to the terminal Ai serving as the input terminal of the output processor 102 in the I/O signal interface circuit 10-i.

Figure 9E:
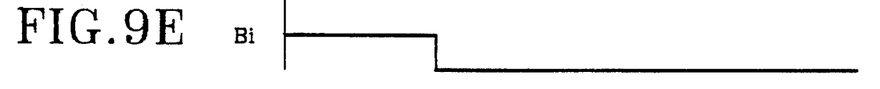

The transistors Q3 to Q7 of the output processor 102 in the I/O signal interface circuit 10-i are turned on to cause the I/O terminal Bi which is the output terminal of the output processor of I/O signal interface circuit 10-i to output a low-level signal at the initial input state of the switch Si as shown in FIG. 9E. At this point, display LEDi is continuously lighted, without flickering and unresponsive to the continuous repeated striking of the switch Si—at least until a different switch is struck.

In another embodiment of the present invention shown in FIG. 10, an I/O terminal Bi can be selectively coupled to any one of a plurality of I/O signal separator input/output pairs and corresponding I/O signal interface circuit. As a result, a desired number of switches and displays can be more readily adaptably connected to the switching circuit shown.

In connection with the present invention, by coupling a number of I/O signal interface circuit and separator pairs in the disclosed manner, input and output terminals associated with function-selecting switching circuits can be reliably embodied in a single terminal construction. Such single terminal construction facilitates adding switches and displays, as necessary, without concern for an otherwise considerable increase in the number of input and output terminals. Additionally, the simplicity of the presently disclosed single terminal construction serves to significantly reduce the number of peripheral circuit components as compared to conventional switching circuits provided with a two terminal I/O construction.

While the present invention has been particularly shown and described with reference to particular embodiments thereof, it will be understood by those skilled in the art that various changes in form and details may be effected herein without departing from the spirit and scope of the invention as defined by the appended claims.

What is claimed is:

1. A single I/O terminal type switching circuit adapted to be connected to a number of switches forming a plurality of parallel switch-path pairs therewith, each said switch-path pair being operably connected to said switching circuit at a respective single terminal thereof, said switching circuit comprising:

at least one I/O signal interface means, coupled at a single terminal thereof to a corresponding first switch-path pair composed of at least a first switch, for detecting when said first switch is initially depressed at which time a current is provided to a current path connected to the single terminal, said current path being maintained, in response to a delay signal, for at least a predetermined delay period following a detection signal generated by said at least one I/O signal interface means to indicate that said first switch was initially depressed; and at least one I/O signal separator means responsive to said detection signal from a corresponding I/O signal interface means for generating said delay signal for said corresponding I/O signal interface means, said delay signal being active at least for said predetermined delay period.

2. The switching circuit of claim 1, wherein said at least one I/O signal interface means and said at least one signal separator means are both at least two in number, said first switch being associated with a first I/O signal interface means and first I/O signal separator means, and a second switch being associated with a second I/O signal interface means and a second I/O signal separator means.

3. The switching circuit of claim 2, wherein a first delay signal is generated by said first I/O signal separator means in response to an initial depression of said corresponding first switch, said first delay signal being deactivated by a depression of said second switch when the first delay signal has been active for longer than said predetermined delay period, and said first delay signal being unaffected by the depression of said second switch when the depression of said second switch occurs before the predetermined delay period from activation of the first delay signal.

4. The switching circuit of claim 1, wherein said at least one I/O signal interface means and said at least one I/O signal separator means are integrally constructed such that inputting and outputting signals to and from corresponding switch path pairs is provided via single terminal interconnections.

5. The switching circuit of claim 1, wherein a subsequent uninterrupted depression of said first switch does not deactivate the delay signal generated by said initial depression.

6. The switching circuit of claim 1, wherein each said I/O signal interface means comprises:

an input processor for outputting, both a response signal from a corresponding switch coupled thereto and input via a respective single terminal and an output signal of the I/O signal separator means, to a corresponding I/O signal separator means; and an output processor connected to an output terminal of said corresponding I/O signal separator means for controlling a respective display element associated with said corresponding switch.

7. The switching circuit of claim 6, wherein said input processor comprises:

a first transistor having a base connected to said I/O terminal, a collector connected to a power supply, and an emitter connected to first and second resistors; and a second transistor having a base connected between said resistors which are connected to said emitter of said first transistor, and a collector connected to said corresponding I/O signal separator means via a terminal.

8. The switching circuit of claim 7, wherein said output processor comprises:

third and fourth transistors respectively having bases connected to an output terminal of said corresponding I/O signal separator means, which serves as an input terminal of said output processor;

fifth and sixth transistors respectively having bases connected to a collector of said fourth transistor, and emitters connected to said power supply; and a seventh transistor having a base connected to a collector of said sixth transistor, and a collector and said input processor commonly connected to said I/O terminal.

9. The switching circuit of claim 1, wherein each said I/O signal separator means comprises:

a first inverter for inverting an output from said corresponding I/O signal interface means;

a delay circuit connected to an output terminal of said first inverter for delaying the output of said first inverter as much as delay time t1;

a second inverter connected to said output terminal of said first inverter, for inverting said output of said first inverter;

a NAND gate for logically combining two outputs of said delay circuit and second inverter;

a fourth inverter connected to an output terminal of said NAND gate for inverting the output of said NAND gate; and a flip-flop having its D input connected to the output of said fourth inverter.

10. The switching circuit of claim 9, wherein each of I/O signal separator means corresponds to one of the switch-path pairs.

11. The switching circuit of claim 9, wherein the outputs of each inverter of each of said at least one I/O signal separator means respectively connected to a D input of a corresponding flip-flop are logically combined by an OR gate, the output of which is supplied to respective clock terminals of each respective flip-flops.

12. The switching circuit of claim 1, wherein the current path is provided through a corresponding display element.

* * * * *